United States Patent [19]

Akiyama

[11] 4,233,632
[45] Nov. 11, 1980

[54] SOLID STATE IMAGE PICKUP DEVICE WITH SUPPRESSED SO-CALLED BLOOMING PHENOMENON

[75] Inventor: Toshiyuki Akiyama, Kokubunji, Japan

[73] Assignee: Hitachi, Ltd., Japan

[21] Appl. No.: 954,863

[22] Filed: Oct. 26, 1978

[30] Foreign Application Priority Data

Nov. 7, 1977 [JP] Japan .......................... 52/148311[U]
May 19, 1978 [JP] Japan .......................... 53/66554[U]
Jun. 23, 1978 [JP] Japan .......................... 53/85372[U]

[51] Int. Cl.³ .............................................. H04N 3/12
[52] U.S. Cl. .................................................... 358/212
[58] Field of Search .............. 358/212, 213; 307/311; 250/208, 209, 211 J, 211 R, 578; 357/30, 32

[56] References Cited

U.S. PATENT DOCUMENTS 3,715,485  2/1973  Weimer ................................. 358/213
3,845,295  10/1974 Williams et al. ................... 250/211 J

*Primary Examiner*—John C. Martin
*Attorney, Agent, or Firm*—Craig & Antonelli

[57] ABSTRACT

A solid state image pickup device includes a matrix array of pn-junction type photo-diodes formed in a monolithic semiconductor substrate, vertical switching FET's of MOS type each connected to the associated photo diode for reading out electric charge stored therein, a vertical shift register for supplying control pulses to gate terminals of the vertical switching MOS FET's, vertical output conductors each for connecting together those of the vertical switching MOS FET's arrayed in the same rows, horizontal switching MOS FET's for horizontal read out connected to the other end of the vertical output conductors, a horizontal shift register for supplying control pulses to gate terminals of the horizontal switching MOS FET's and a horizontal output conductor connecting in common the outputs of the horizontal switching MOS FET's. The image pickup device further comprises means for varying the potential at the grounded terminal of the vertical shift register during the horizontal blanking period, and a group of MOS type FET switches connected to the other ends of the vertical output conductors, whereby surplus electric charge at the photo-diodes, if any, is removed through the MOS FET switches during the horizontal blanking period.

6 Claims, 17 Drawing Figures

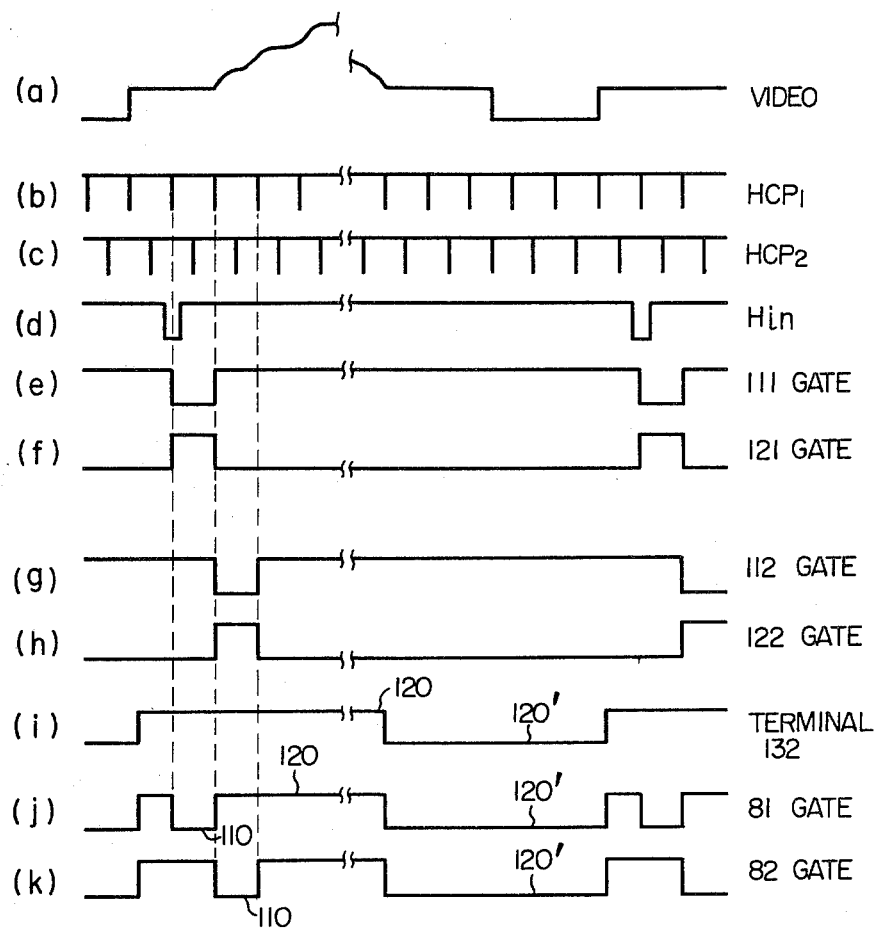
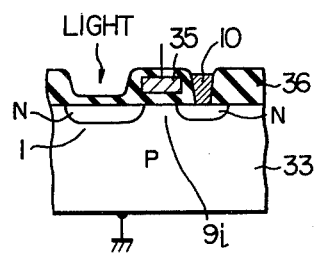
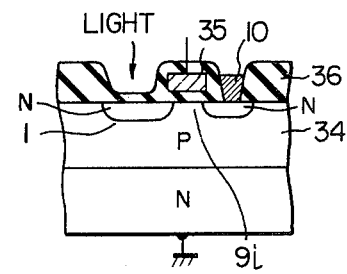

SOLID STATE IMAGE PICKUP DEVICE WITH SUPPRESSED SO-CALLED BLOOMING PHENOMENON

The present invention relates to a solid state image pickup device of semiconductor type and in particular to a novel structure of such image pickup device in which means for suppressing a so-called blooming phenomenon are provided.

There have been typically known two types of solid state image pickup devices or tubes, i.e. the one constituted by CTD's (charge transfer device) and the other constituted by MOST's (metal oxide semiconductor type transistor). For example, reference is to be made to U.S. Pat. No. 3,801,884 and J. D. Plumer's et al "A Low-Light-Level Self-Scanned MOS Image Sensor", ISSCC 72 Digest of Technical Papers, pp 30 to 31.

These solid state image pickup devices are at present developed to a practicable technical state. However, there is a problem remaining to be solved. That is the occurrence of the so-called blooming phenomenon in which strips in white make appearance in the reproduced image. This phenomenon may be explained by the fact that incident light of high intensity on a photo-diode constituting the image scanning screen will bring about generation of surplus photo-electric charge over the saturated charge level stored in the photo-diode, which surplus charge is transferred to the adjacent photo-diodes to be mixed with the signal charges of the latter. Consequently, the stripes in white appear in the image reproduced from the video signal output from the solid state image pickup device. in the case of an image pickup device constituted by MOST's, vertical fringes or stripes in white are produced in the reproduced image, because the photo-diodes arrayed in the same row of the matrix array are connected to the common vertical output line or conductor. It is obvious that such stripes in white, whether vertical or not, will deteriorate the quality of the reproduced image to a disadvantage for practical applications.

An object of the present invention is to provide a solid state image pickup device of a novel and improved structure which allows the blooming phenomenon to be satisfactorily suppressed.

In view of the above and other objects which will become more apparent as description proceeds, there is provided according to a general aspect of the invention a solid state image pickup device which incorporates therein means for removing the surplus charge from the photo-diode during the blanking period in the operation of the image pickup device.

More specifically, the subject matter of the invention resides in a solid state image pickup device including a plurality of light sensitive (photoelectric) elements arrayed in two dimensions or in matrix, the same plurality of vertical switching elements each associated with each of the light sensitive elements for reading out the signal electric charge stored therein, a vertical scanning circuit for supplying control pulses to the control terminals of the vertical switching elements, common vertical output lines or conductors each for connecting together the output terminals of the vertical switching elements arrayed in the same row of the matrix, horizontal switching elements for reading out the stored charge connected to ends of the vertical output lines, and a horizontal scanning circuit for supplying the control pulses to the control terminals of the horizontal switching elements. The invention is characterized by means for removing the surplus charge by varying the potential level at the control electrodes of the vertical switching elements during the horizontal blanking period.

In a preferred embodiment of the invention, the vertical reading switching element may be constituted by MOS FET (field effect transistor). In this case, the suppression of the "blooming" phenomenon can be equally accomplished also by varying the potential at a semiconductor substrate in which MOS FET's and photo-diodes are integrally formed.

The above and other objects will become more apparent by the following description taken in conjunction with the accompanying drawings in which:

FIGS. 6A and 6B show an exemplary embodiment of the invention, in which FIG. 6A shows a schematic circuit diagram of a solid state image pickup device according to the invention, while FIG. 6B shows a circuit diagram of a pulse generator circuit for producing a pulse signal to be applied to a grounded terminal of a vertical scanning circuit shown in FIG. 6A;

FIG. 11B is a signal waveform diagram to illustrate operation of the same;

FIGS. 12A and 12B are schematic sectional views to illustrate further embodiment of the invention.

Figure 1:
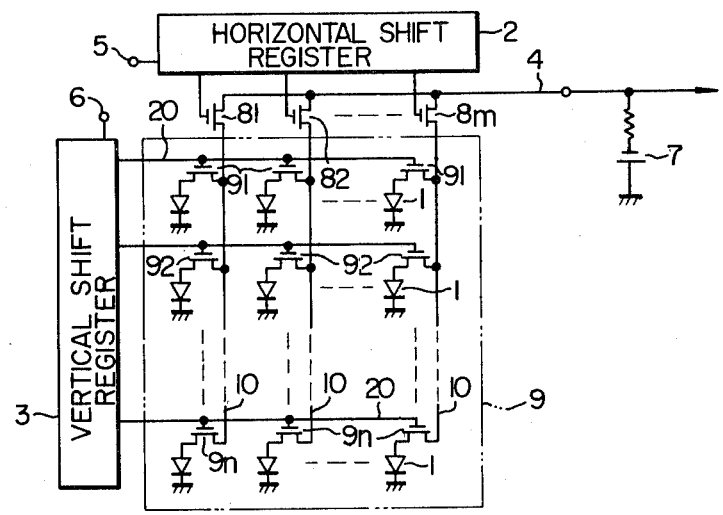
FIG. 1 is a circuit diagram showing schematically an arrangement of a hitherto known MOS type solid state image pickup device.

In order to have a better understanding of the invention, description will be first made of a typical example of the hitherto known solid state image pickup device implemented with MOST's by referring to FIG. 1.

Figure 2:
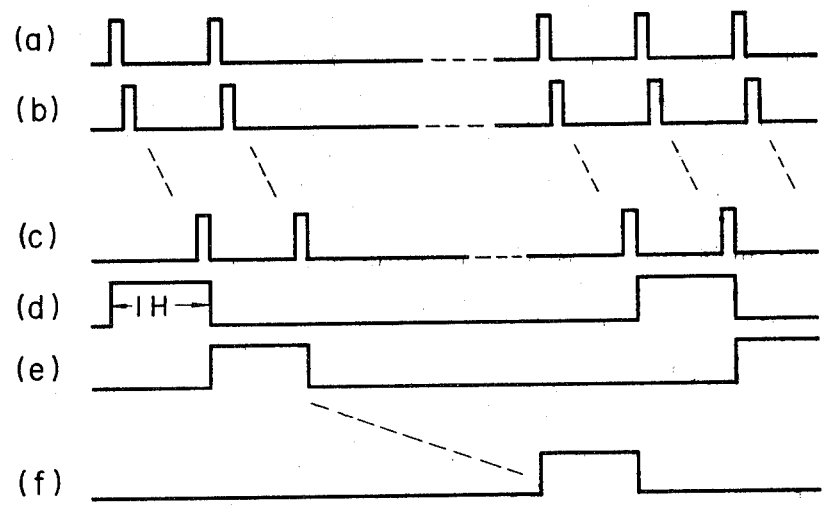
FIG. 2 shows signal wave diagrams to illustrate operation of the same.

As can be seen from this figure, the solid state image pickup device is composed of following parts: a light receiving portion 9 constituted by a plurality of photosensitive elements such as photo-diodes 1 arrayed in a matrix-like configuration; vertical reading switching MOST's 91 to 9n (hereinafter referred to simply as vertical MOST) and horizontal reading switching MOST's 81 to 8m both serving for reading out the photo-electric signals stored in the photo diodes 1; a vertical shift register 3 and a horizontal shift register 2 constituting a vertical scanning circuit and a horizontal scanning circuit, respectively, for switching the associated MOST switches in a predetermined proper sequence; and a horizontal output signal line 4. The vertical and the horizontal MOST's are controlled by gate pulses derived from the associated stages of the respective vertical and horizontal shift registers 3 and 2 to perform the switching operation. FIG. 2 illustrates output pulse signals obtained from the horizontal and vertical shift registers. In the figure, the output pulses available from the individual stages of the horizontal shift register 2 are shown at (a), (b) and (c), while the output pulses from the individual stages of the vertical shift register 3 are exemplarily shown at (d), (e) and (f). It should be mentioned that pulse intervals for the horizontal blanking period and the vertical blanking period are omitted from illustration.

Referring again to FIG. 1, reference numerals 5 and 6 denote a pulse input terminal and a grounded terminal of the horizontal and vertical shift registers 2 and 3, respectively, 7 denotes a voltage source for applying a backward bias voltage to the photo-diodes 1 for reading out the photo-electric signals therefrom, and numeral 10 denotes a vertical output signal line and numeral 20 denotes a vertical MOST switch control line. With such arrangement described above, the photo-electric signals stored in the photo-diodes 1 are sequentially output to the horizontal signal output line 4 and fed to a signal processing circuit (not shown).

In the solid state image pickup device of the above-mentioned structure, the so-called "blooming" phenomenon in which vertical stripes in white make appearance will occur, when the quantity of incident light exceeds a predetermined level, thereby to involve a remarkable deterioration in the quality of reproduced image, as described hereinbefore. Such undesirable "blooming" phenomenon is described below.

Figure 3:
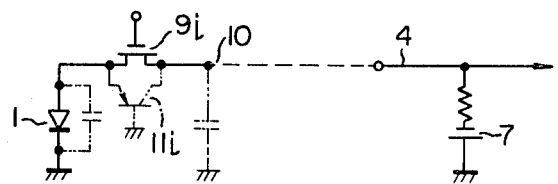
FIG. 3 shows a equivalent circuit of a signle photo-diode and a vertical MOST (switching transistor of MOS type) connected thereto in the image pickup device shown in FIG. 1.
Figure 4:
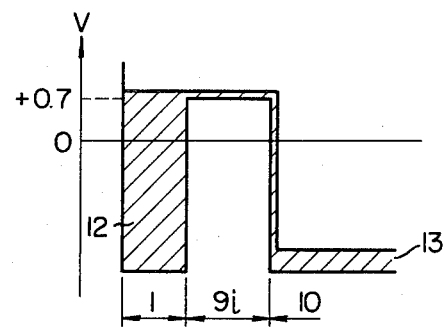
FIG. 4 illustrates schematically the state of charge stored in the photo-diode shown in FIG. 3 upon impingiment of high intensity incident light.

FIGS. 3 and 4 are to illustrate the mechanism of generation of the "blooming" phenomenon, in which FIG. 3 shows an equivalent circuit extending from a given one of the photo-diodes 1 to the horizontal output line 4 through the associated vertical MOST 9i, while FIG. 4 schematically illustrates the states of electrical charge potentials at various circuit points shown in FIG. 3 on the assumption that the given photo-diode is exposed to irradiation of high intensity light. Accordingly, this photo-diode 1 is biased forwardly due to a large quantity of electric charge 12 (FIG. 4) stored therein. Further charge produced subsequently due to the photocurrent effect is transferred to the vertical output line 10 as overflow charge through a parasitic transistor 11a formed below the vertical MOST 9i which is in the OFF state. Electric charge 13 (FIG. 4) thus transferred to the vertical output line 10 as the overflow charge during a single horizontal scanning period is read out simultaneously with the charges read from the other photo-diodes connected to the vertical output line 10, thereby giving rise to the "blooming" phenomenon; i.e. generation of vertical stripes in white in the reproduced image. With the invention, it is intended to eliminate such disadvantage as the "blooming" phenomenon.

Figure 5:
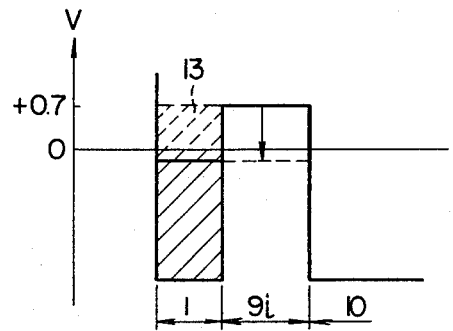
FIG. 5 is a similar view to FIG. 4 but illustrates schematically the principle of the invention.

Now, the invention will be described in detail in conjunction with exemplary embodiments thereof with reference to the drawings. FIG. 5 is a view similar to FIG. 3 showing schematically the state of electric charge in the circuit of a given photo-diode exposed to a high intensity light irradiation and the associated vertical MOST 9i connected to the above-mentioned photo-diode 1, to illustrate the principle of the invention. In the figure, area 13 hatched in phantom line represents a surplus charge transferred to the output line as the overflow of the electric charge stored in the photo-diode 1 during a single horizontal scanning period. According to the teaching of the invention, such surplus charge 13 is removed by reading out during the horizontal blanking period by correspondingly controlling the gate voltage applied to the vertical MOST 9i, thereby to prevent the overflow of the surplus charge to the vertical output line 10 from the photo-diode 1 during the succeeding horizontal scanning period with a view to ultimately suppressing the "blooming" phenomenon.

Being expressed mathematically, the surplus charge is read out, when the potential $V_P$ across the photo-diode 1 increases beyond a predetermined value $V_{PO}$ which can be determined from the following relation:

$$|V_{PO}| = |V_G - V_T|$$

where $V_G$ represents the gate voltage of the vertical MOST 9i and $V_T$ represents the threshold value $V_T$ thereof. As is obvious from the expression above, it is of course possible to attain the similar effect by varying the ground potential of the photo-diode 1.

Figure 6A:
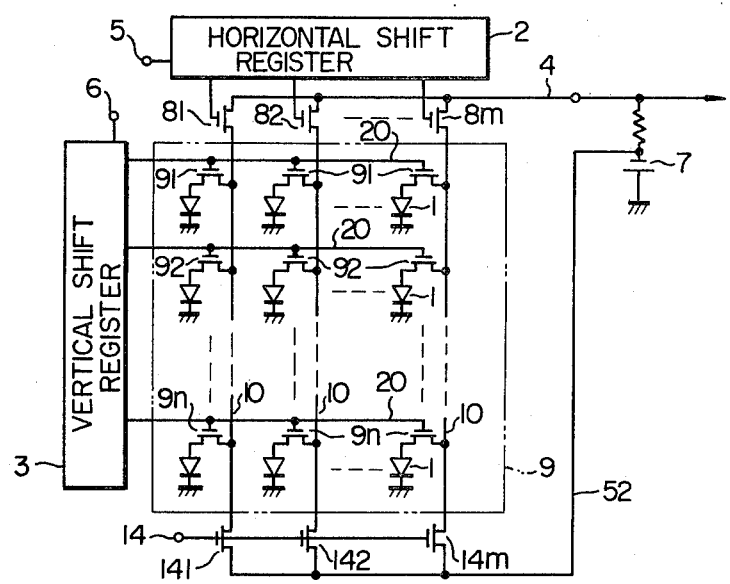
Figure 6B:
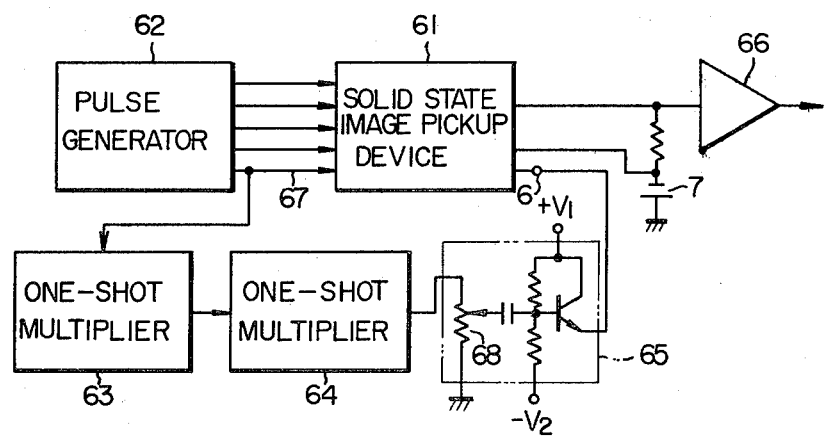

FIG. 6A shows an embodiment of the invention which is so arranged that the gate voltage of all the vertical MOST's is lowered by a predetermined value relative to the potential of the semiconductor substrate during the horizontal blanking period by correspondingly lowering the potential at the normally grounded terminal 6. An exemplary embodiment of the circuit for varying the potential level at the normally grounded terminal 6 during the horizontal blanking period is shown in FIG. 6B.

Referring to FIG. 6A, reference numeral 14 denotes an input terminal which is applied with a gate pulse signal for opening simultaneously MOST switches 141 to 14m which have one ends connected to the vertical MOST switches 91 to 9n and other ends connected in common to the voltage source 7 by line 52. The circuit shown in FIG. 6A other than this arrangement has the same configuration as the one shown in FIG. 1. Referring to FIG. 6B which shows an exemplary embodiment of the pulse generator circuit for producing the pulse signal to be applied to the normally grounded terminal 6 of the vertical shift register 3, numeral 61 denotes a solid state image pickup device composed of the photosensitive elements, a scanning circuit and the horizontal and vertical MOST's 62 denotes a pulse generator for producing pulses such as the clock pulse and input pulse for the scanning circuit, gate pulses for the horizontal and vertical MOST's, a blanking pulse and the gate pulse for the MOST switches 141 to 14m, numerals 63 and 64 denotes one-shot multipliers, 65 denotes a pulse amplitude adjusting circuit having a variable resistor 68, and numeral 66 denotes a preamplifier. Additionally, reference numeral 67 represents the horizontal blanking pulse signal which is supplied to the one-shot multiplier 63 for determining the phase of pulse. The output from the one-shot multiplier 63 is fed to the other one-shot multiplier 64 for determining the pulse width. The output from the multiplier 64 in turn is supplied to the amplitude adjusting circuit 65 from which the control pulse signal having an adjusted amplitude is produced. The pulse phase as well as the pulse width as determined by the one-shot multipliers 63 and 64 are so selected that the control pulse signal thus obtained is substantially in phase with the horizontal blanking pulse signal or at least covered by the duration of the horizontal blanking pulse.

Figure 7:
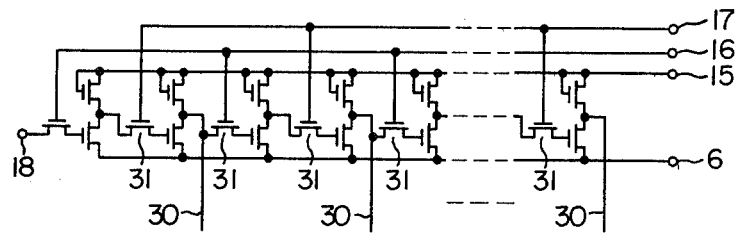
FIG. 7 shows a exemplary circuit arrangement of a vertical scanning circuit employed in the image pickup device according to the invention.

FIG. 7 shows an exemplary embodiment of a scanning circuit which is particularly suited for the vertical scanning. The scanning circuit is composed of a plurality of inverter circuits constituted by MOST's and transfer MOST's. In FIG. 7, reference numeral 18 denotes a pulse input terminal and 15 denotes a conductor connected to a power supply source. Numerals 16 and 17 designate input terminals for the clock pulse signals which are out of phase with each other. The output terminals 30 for the vertical scanning pulses are provided for every other inverter stage. The vertical scanning pulses are sequentially fed to the vertical MOST's 91 to 9n. More specifically, the pulses applied to the input terminal 18 are sequentially transferred through the inverter and a transfer MOST 31 under the timing of the clock pulses applied to the terminals 16 and 17, whereby the pulses appearing at the output terminals 30 are sequentially coupled to the gate terminals of the horizontal MOST's 8i. On the other hand, the potential at the normally grounded terminal 6 is caused to vary during the horizontal blanking period by the circuit shown in FIG. 6B.

Figure 8:
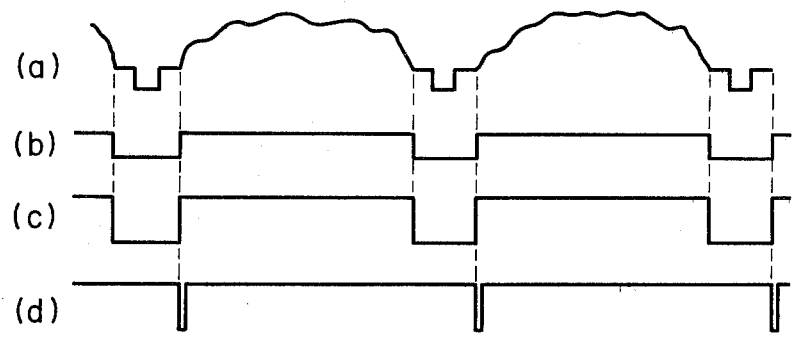
FIG. 8 is a signal waveform diagram to illustrate operation of the circuits shown in FIG. 6A.

FIG. 8 shows signal waveforms appearing in the circuit shown in FIG. 6A. The video signal finally obtained is shown at (a) and the pulse signal applied to the normally grounded terminal 6 of the vertical scanning register 3 is illustrated at (b). As the result of the application of the pulse signal (b) at the terminal 6, the gate voltage $V_B$ of all the vertical MOST's 91 to 9n is lowered by a predetermined voltage value relative to the potential at the substrate. Under the conditions, only those vertical MOST's which have the threshold value lower than the gate voltage due to the charge stored in the associated photo-diodes are turned on. The surplus charge stored in the photo-diodes beyond the predetermined level is read out to be removed through the MOST switches 141 to 14m which are opened simultaneously during the blanking period by the pulse signal shown at (c) in FIG. 8. Subsequently, the pulse signals applied to the normally grounded terminal 6 of the vertical shift register 3 as well as the gate electrodes of the MOST switches 141 to 14m are cleared, and then the input pulse signal shown in FIG. 8 at (d) is applied to the input terminal 5 of the horizontal shift register 2. In this manner, the video signal immune to the "blooming" phenomenon can be obtained. It is not necessarily required that the pulse applied to the MOST switches 141 to 14m for removing the surplus charge has the same pulse width as the duration of the horizontal blanking period. Instead, the pulse width may as well be shorter than the horizontal blanking period, since then erroneous operation of the vertical shift register can be excluded more effectively when a clock pulse (not shown) is applied after the ground potential has been restored at the terminal 6.

In a second exemplary embodiment of the invention, means for removing the surplus charge is provided for the horizontal output line without resorting to the use of the MOST switches 141 to 14m shown in FIG. 6A. In this case, the surplus charge is transferred to the vertical output line 10 by lowering the gate voltage of all vertical MOST's, by correspondingly lowering the potential at the normally grounded terminal 6 of the vertical shift register 3 during the horizontal blanking period by means of the circuit such as shown in FIG. 6B, for example, Subsequently, all the horizontal MOST's 8i are turned on during the same horizontal blanking period by applying the pulse shown at (c) in FIG. 8 to the source terminal and the grounded terminal of a horizontal shift register of the same circuit configuration as the vertical shift register such as the one shown in FIG. 7, for example. In this manner, the surplus charge stored in the photo-diodes beyond a predetermined level and transferred to the vertical output line 10 can be removed through the horizontal MOST's 8i in the conductive state during the horizontal blanking period. Thereafter, the ground potentials of the vertical and the horizontal shift register 3 and 2 are restored. Then, the video signal immune to the blooming phenomenon can be obtained through the normal operations of the vertical and the horizontal shift register.

According to another embodiment of the invention for removing sequentially the surplus charge at the photo-diodes through the horizontal MOST's 8i, the clock pulse input terminals 16 and 17 shown in FIG. 7 are applied with a voltage of a sufficient magnitude for all the transfer MOST's 31 to be turned on. Thereafter, an input pulse is applied at the input terminal 18 to be shifted through the transfer MOST's 31 at a high speed. In this case, since the scanning speed is increased accompanied with the shortened conductive duration of the horizontal MOST's 8i, the pulse width of the input pulse has to be selected so large as to assure an adequately long conductive duration for the horizontal MOST's 8i.

Figure 9:
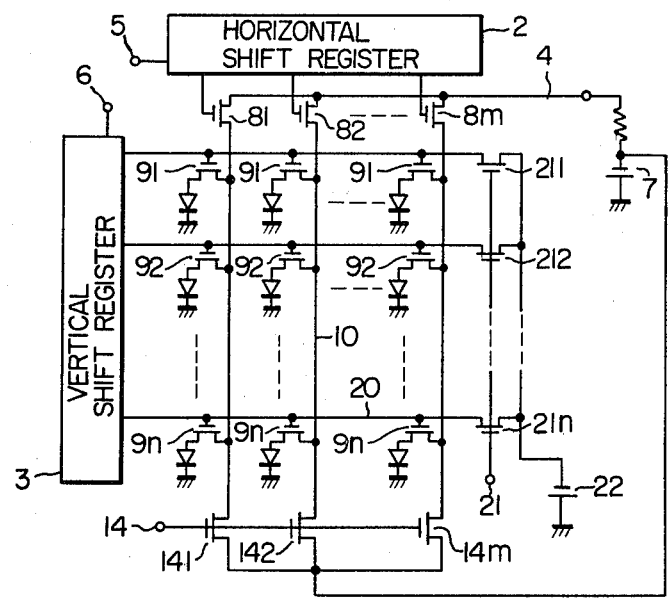
FIGS. 9 and 10 show schematically circuit arrangements of the solid state image pickup device according to other embodiments of the invention.

A third exemplary embodiment of the invention in which the gate voltage $V_G$ undergoes variation is shown in FIG. 9, in which reference numeral 21 denotes an input terminal to be applied with a control pulse for varying the gate voltage $V_G$, 211 to 21n denote MOST's controlled by the control pulse, and 22 denotes a voltage source for lowering the gate voltage $V_G$ of the vertical MOST's 9i. In the case of the present embodiment, all the MOST's 211 to 21n are turned on during the horizontal blanking period, while all the vertical MOST 9i receive the voltage of the source 22. The vertical shift register must be so constructed as to be protected from any erroneous operation due to the voltage of the source 22 during the horizontal blanking period. In this connection, it should be mentioned that the shift register shown in FIG. 7 is insusceptible to such erroneous operation.

In FIG. 9, MOST switches 14i are provided in addition to the horizontal MOST's 8i and adapted to be turned on during the horizontal blanking period in response to the pulse applied to a common gate terminal 14, thereby to allow the signal charge to be read out. In this case, the horizontal MOST's 8i remain of course in the non-conductive state during the horizontal blanking period.

Figure 10:
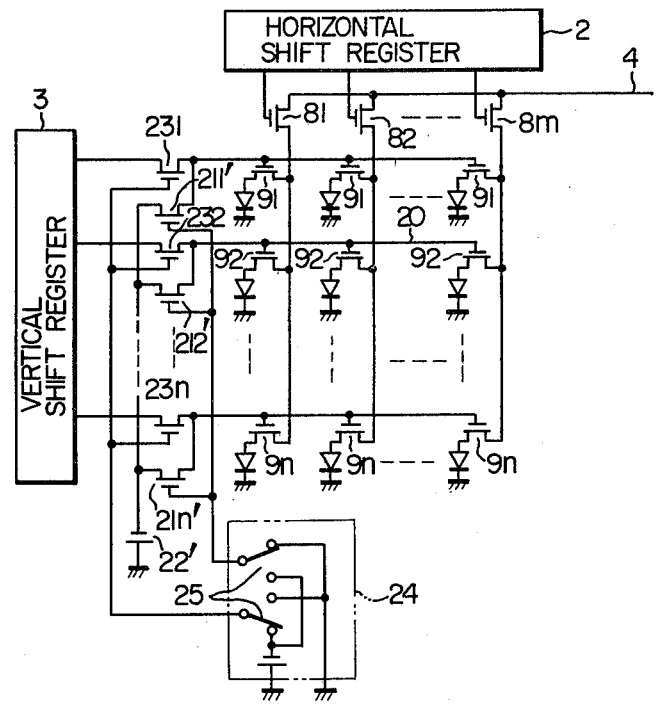

FIG. 10 shows a fourth exemplary embodiment which is a modification of the image pickup device shown in FIG. 9. A parallel connection of MOST switches such as 21i' and 23i are connected in each of the gate conductors 20. Further, a selection circuit 24 is provided to select either the output pulse from the vertical shift register 3 as a vertical scanning circuit or the voltage from the voltage source 22'. The MOST switches 21i are turned on during the horizontal blanking period by the selector circuit 24 having selecting switches 25, thereby to change the gate potential $V_G$ of the vertical MOST's 9i. The MOST switches 23i are turned on the period except the horizontal blanking period, whereby the output pulses from the vertical scanning circuit 3 are sequentially applied to the vertical MOST's 9i. In the case of this embodiment, the vertical scanning circuit 3 is not directly applied with the voltage of the source 22'. In other words, since current flow to the vertical shift register 3 is inhibited, the gate potential $V_G$ of the vertical MOST's 9i can be set at the same level.

With the arrangement shown in FIG. 10, the surplus charge is read out through the horizontal output line 4 in a similar manner as in the case of the image pickup device according to the second embodiment, since there are provided no MOST switches 14l to 14m, although these MOST switches can be additionally used as in the case of the device shown in FIG. 9.

In the case of the embodiments described so far, the upper limit of the light quantity for preventing the blooming phenomenon is determined by the magnitude of decrease in the gate voltage. For example, when more than 70% of the charge stored until the photo-diode has been biased forwardly is read out during the blanking period, the upper limit of the light quantity for preventing the occurrence of the blooming phenomenon can be increased about 80 times as high as the upper limit allowable when such read out operation is not carried out.

Figure 11A:
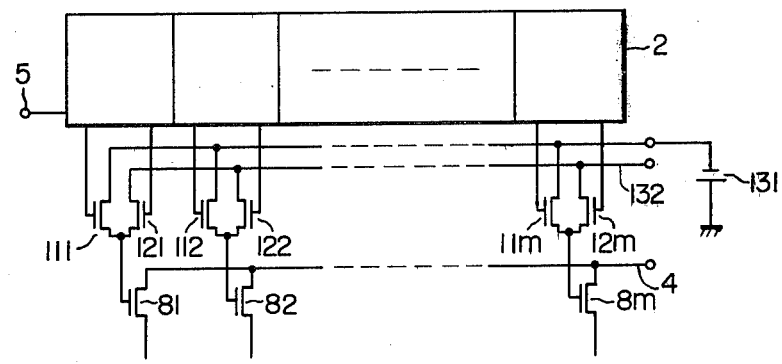
FIG. 11A shows a circuit diagram of still another embodiment of the invention.

FIGS. 11A and 11B show a fifth exemplary embodiment of the invention in which a pair of pulse trains of opposite polarities available from the horizontal shift register 2 are utilized as the switching pulses for the MOST switches. Referring to FIG. 11A, pulses of one polarity are supplied to the gate electrodes of the MOST switches 111, 112, . . . 11m connected to the power source 131 for supplying the gate voltage to turn on the horizontal MOST's 8i, while the pulses of the other polarity are coupled to the gate electrodes of the MOST switches 121, 122, . . . 12m. Thus, the pulse width of the pulses applied to the gates of the horizontal MOST's 8i is given by the output pulse from the horizontal shift register 2, while the amplitude of the pulse is determined by the voltage level of the external power supply 131. Consequently, the voltage applied to the gates of the horizontal MOST's 8i can be controlled by the pulse applied across the power source 131 and the terminal 132 without disturbing operation of the horizontal shift register 2. The horizontal shift register 2 may be generally implemented by inverters and shifting MOST's in a simplified arrangement. To this end, the shift register shown in FIG. 7 can be employed.

Referring to FIG. 11B which shows signal waveforms to illustrate the operations of the above-described circuit, the video signal as obtained is shown at (a), the clock pulse trains HCP$_1$ and HCP$_2$ of the horizontal shift registers are shown at (b) and (c), while at (d) there is shown the input pulse Hin applied immediately before the termination of the horizontal blanking duration of the horizontal shift register 2. The two output pulses having opposite polarities applied to the gates of the MOST switches 111 and 122 from the horizontal shift register 2 are shown at (e) and (f). The pulses output from the horizontal shift register 2 and applied to the gates of the MOST switches 112 and 122 are shown at (g) and (h).

Assuming that the pulse signal of the waveform (i) is applied to the terminal 132, the signals of the waveforms shown at (j) and (k) in FIG. 11B are applied to the gate electrodes of the horizontal MOST's 81 and 82, as will be appreciated from the circuit arrangement shown in FIG. 11A. Since the gates of the horizontal MOST's 81, 82, . . . 8m are coupled to the power source 131 and the terminal 132 through the MOST switches 111, 112, . . . , 11m and 121, 122, . . . 12m, the potential at these gates will take the voltage level 110 (e.g. $-12$ V) of the power source 131 as shown at (j) and (k) only when the pulses shown at (e) and (g) are applied, and remain otherwise at the voltage level 120 (off-level or OV) of the terminal 132 through the MOSt switches 121, 122, . . . 12m. Accordingly, when the pulse signal (i) which takes the voltage level 120' during the horizontal blanking period is applied to the terminal 132, the gate electrodes of all the horizontal MOST's 81, 82, . . . 8m are applied with the gating voltage 120' during the horizontal blanking period.

Next, description will be made of the image pickup device according to a sixth embodiment of the invention. In the foregoing description, it has been assumed that the gate voltage $V_G$ of the vertical MOST's 9i is changed. However, in the case of the sixth embodiment, the ground potential of the photo-diodes is varied. FIGS. 12A and 12B are schematic sectional views of a vertical MOST 9i of a MOS type solid state image pickup device and a photo-diode 1, respectively. In FIG. 12A, reference numeral 33 denotes a P-type substrate, 35 denotes a gate electrode (of N-channel) of the vertical MOST 9i, and 36 denotes an isolation layer. The photo-diode shown in FIG. 12B is implemented in a three-layer structure with a view to attaining uniformity in the sensitivity. Numeral 34 denotes a P-type semiconductor layer. With these structures, it is possible to remove the surplus charge by varying the potential at the substrate 33 or the semiconductor layer 34 during the horizontal blanking period. In either case, the surplus charge is transferred to the vertical output line 10 and hence removed in the same manner as in the case of the embodiments described hereinbefore.

In the image pickup devices described above so far, several tens of percent of signal are sliced off, even in the case of the video signal immune to the blooming phenomenon, involving a loss in the dynamic range disadvantageously.

Figure 13:
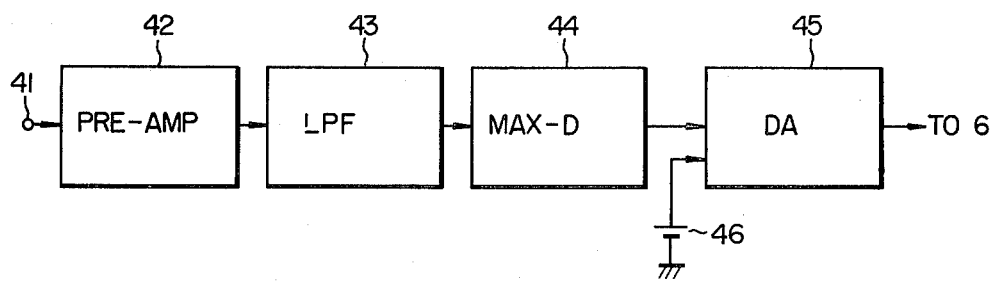
FIGS. 13 and 14 are block diagrams showing further embodiments of the invention.

The circuit arrangement shown in FIG. 13 is so designed as to eliminate the above disadvantage by varying the voltage applied to the gates of the vertical MOST's during the horizontal blanking period in dependence on the intensity of the incident light at the associated photo-diodes. In FIG. 13, reference numeral 41 denotes an output terminal of a solid state image pickup device, 42 a preamplifier, 43 a low pass filter (LPF), 44 a maximum value detector circuit (MAX-D), 45 a differential amplifier (DA), and 46 a reference voltage source. The output video signal of the solid state image pickup device available from the output terminal is amplified by the preamplifier 42 and the signal component of a low band is extracted through the low pass filter 43. Subsequently, peak level of the video signal during a single horizontal scanning period or a single field period is detected by the maximum value detector 44 and compared with the reference voltage 46 at the differential amplifier 45, the output of which is a DC signal of a magnitude proportional to the output signal level of the image pickup device. When the DC signal thus obtained is applied to the normally grounded terminal 6 of the vertical shift register 3 shown at FIG. 6A, the gate potential of the vertical MOST 9i will vary in dependence on the output signal level of the image pickup device. With such arrangement, the percentage of the signal charge as removed or sliced away is increased only when the incident light is of such intensity as to incur the blooming phenomenon, while the percentage of the signal charge as sliced off is decreased when the incident light from an object to be picked up is too low to give rise to the occurrence of the blooming phenomenon, whereby the dynamic range is not subjected to any limitation in the latter case.

A level limiter circuit may be provided in succession to the differential amplifier 45 to determine the range in which the blooming phenomenon is to be suppressed.

Figure 14:
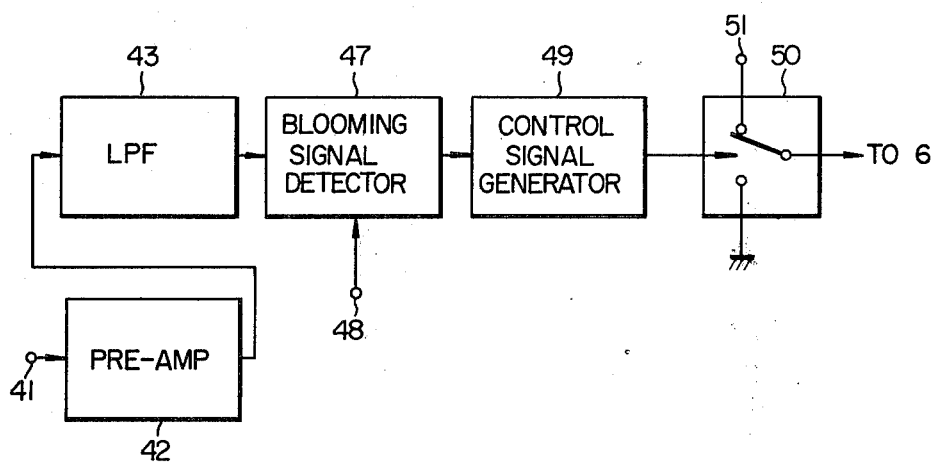

FIG. 14 shows still another embodiment of the invention, in which the suppression of the blooming phenomenon is executed during the first horizontal scanning period for every field of the video signal in the manner described hereinbefore in conjunction with the first embodiment of the invention, whereby the operation of the circuitry for preventing the blooming is inhibited during the remaining portion of the field when no blooming signal (equivalent to the surplus charge) is detected during the first horizontal scanning period.

The presence of the blooming signal can be detected in dependence on whether any signal is present or not during the horizontal blanking period. Referring to FIG. 14, the video output signal from the output terminal 41 of the solid state image pickup device according to the first embodiment is amplified by a preamplifier 42 and a low frequency component is extracted from a low pass filter 43, the output from which is applied to a blooming detector circuit 47 having a terminal 48 applied with a detection pulse signal in synchronism with the horizontal synchronizing signal. When the blooming signal is detected, a control signal is produced from a control signal generator circuit 49 for controlling the switching element 50 thereby to apply the potential at the normally terminal 51 to the grounded terminal 6 of the vertical shift register. On the other hand, when no blooming signal is detected, the normally grounded terminal 6 is maintained at the ground potential. In the case of the circuit arrangement shown in FIG. 6A, the blooming signal is available from the line 50. The blooming signal detector circuit may be constituted by a conventional sample-and-hold circuit.

The blooming suppressing operation described above may be effected for every frame instead of field or alternatively for every horizontal scanning period.

What we claim is:

1. A solid state image pickup device including a plurality of photo-electric elements arrayed in a matrix-like configuration, vertical switching elements each associated with each of said photo-electric elements for reading out electric charge stored therein, a vertical scanning circuit for supplying control pulses to control terminals of said vertical switching elements, common vertical output conductors each for connecting together output terminals of those of said vertical switching elements which are arrayed on the same column of said matrix-like configuration, horizontal switching elements for read out connected to respective one ends of said vertical output conductors, and a horizontal scanning circuit for supplying control pulses to the control terminals of said horizontal switching elements, further including:

means for removing surplus electric charges at said photo-electric elements by varying potential at the control terminals of said vertical switching elements during a blanking period.

2. A solid state image pickup device according to claim 1, wherein said vertical switching element is constituted by MOS FET.

3. A solid state image pickup device according to claim 1, wherein said means for removing the surplus charge includes means for varying the potential at a normally grounded terminal of said vertical scanning circuit.

4. A solid state image pickup device according to claim 3, wherein said surplus charge removing means includes a first group of switch elements each connected to the other end of said vertical output conductor.

5. A solid state image pickup device according to claim 3, wherein said surplus charge removing means includes a second group of switch elements each having one end connected to the output lines of said vertical scanning circuit and a power source connected to the other ends of said second switch elements.

6. A solid state image pickup device according to claim 5, wherein said surplus charge removing means further include a third group of switch elements provided between the output terminals of said vertical scanning circuit and said control terminals of said vertical switching elements, and selector means for opening and closing alternately said switch elements of said second and third groups.

* * * * *